(12) United States Patent
Hwang et al.

(10) Patent No.: US 12,187,919 B2
(45) Date of Patent: Jan. 7, 2025

(54) POLISHING SLURRY COMPOSITION (71) Applicant: KCTECH CO., LTD., Gyeonggi-do (KR)

(72) Inventors: Jin Sook Hwang, Gyeonggi-do (KR); Hyun Goo Kong, Gyeonggi-do (KR); Yun Su Kim, Gyeonggi-do (KR)

(73) Assignee: KCTECH Co., Ltd. (KR)

( * ) Notice: Subject to any disclaimer, the term of this patent is extended or adjusted under 35 U.S.C. 154(b) by 395 days.

(21) Appl. No.: 17/552,932

(22) Filed: Dec. 16, 2021

(65) Prior Publication Data

US 2022/0195243 A1 Jun. 23, 2022

(30) Foreign Application Priority Data

Dec. 18, 2020 (KR) .................. 10-2020-0178827

(51) Int. Cl.
*C09G 1/02* (2006.01)
*B82Y 40/00* (2011.01)
*H01L 21/304* (2006.01)

(52) U.S. Cl.
CPC ............... *C09G 1/02* (2013.01); *B82Y 40/00* (2013.01); *H01L 21/304* (2013.01)

(58) Field of Classification Search
CPC ...... C09G 1/02; H01L 21/304; H01L 21/3212
See application file for complete search history.

(56) References Cited

U.S. PATENT DOCUMENTS

2006/0234509 A1* 10/2006 Small ................. C09G 1/02 438/692
2020/0024515 A1* 1/2020 Lu .................... C09K 13/02
2020/0157381 A1 5/2020 Ahn et al.

FOREIGN PATENT DOCUMENTS

| CN | 1720313 A | 1/2006 |
|---|---|---|
| CN | 104745092 A | 7/2015 |
| CN | 106085245 A | 11/2016 |
| CN | 108129991 A | 6/2018 |
| CN | 110983340 A | 4/2020 |
| KR | 20180117608 A | 10/2018 |
| KR | 20190057084 A | 5/2019 |
| KR | 20190057330 A | 5/2019 |
| KR | 20200014244 A | 2/2020 |
| TW | 201936882 A | 9/2019 |

OTHER PUBLICATIONS

Wikipedia "Chitosan" via https://en.wikipedia.org/wiki/Chitosan ; pp. 1-15 (Year: 2024).*
Wikipedia "Cyclodextrin" via https://en.wikipedia.org/wiki/Cyclodextrin ; pages (Year: 2024).*
Wikipedia "Glycosidic bond" via https://en.wikipedia.org/wiki/Glycosidic_bond ; pp. 1-7 (Year: 2023).*

(Continued)

*Primary Examiner* — Binh X Tran
(74) *Attorney, Agent, or Firm* — KDW Firm PLLC (57) ABSTRACT

A polishing slurry composition is provided. The polishing slurry composition includes polishing particles, a first polishing inhibitor containing a hydrophobic amino acid, and a second polishing inhibitor containing a cyclic polymer, and the first polishing inhibitor and the second polishing inhibitor are different.

11 Claims, 2 Drawing Sheets

(56) References Cited

OTHER PUBLICATIONS

Wikipedia "Ferric nitrate" via https://en.wikipedia.org/wiki/Iron(III)_nitrate ; pp. 1-4 (Year: 2024).*
"Understanding Amino Acid Side Chain Characteristics for the MCAT" via https://leah4sci.com/understanding-amino-acid-side-chain-characteristics-for-the-mcat/#:~:text=Since%20glycine%20has%202%20hydrogen,glycine%20the%20smallest%20amino%20acid ; pp. 1-38 (Year: 2015).*
Widyarani et al. "Production of hydrophobic amino acids from biobased resources: wheat gluten and rubber seed proteins" via https://www.ncbi.nlm.nih.gov/pmc/articles/PMC4989023/#:~:text=Valine%2C%20proline%2C%20and%20leucine%20were,and%20BSA%2C%20respectively%20(Table%20%E2%80%8B ; pages (Year: 2016).*
Wikipedia "Cysteine" via https://en.wikipedia.org/wiki/Cysteine#:~:text=Therefore%2C%20cysteine%20is%20now%20often,as%20slightly%20polar%2C%20or%20polar ; pp. 1-10 (Year: 2024).*

* cited by examiner

POLISHING SLURRY COMPOSITION

CROSS-REFERENCE TO RELATED APPLICATION

This application claims the benefit of Korean Patent Application No. 10-2020-0178827 filed on Dec. 18, 2020, in the Korean Intellectual Property Office, the entire disclosure of which is incorporated herein by reference for all purposes.

BACKGROUND

1. Field of the Invention

One or more example embodiments relate to a polishing slurry composition.

2. Description of the Related Art

A semiconductor device to which integrated circuit technology is applied includes numerous functional elements such as transistors, capacitors, and resistors, and these individual functional elements are connected to each other by wiring designed in a certain shape to constitute a circuit. As semiconductor devices become highly integrated, high-density, and multi-layered, a finer pattern forming technique is used, and accordingly, the surface structure of a semiconductor device is further complicated, and a step between interlayer films is also increased.

When the step between interlayer films occurs during a semiconductor device manufacturing process, it is important to minimize the step because it causes a defect in the process. Accordingly, in order to reduce the step between the interlayer films, a planarization process of the semiconductor wafer is required.

The planarization process refers to a process of flatly polishing the surface of a semiconductor substrate using a slurry containing an abrasive and various compounds while performing rotary motion in contact with a polishing pad. In general, in a polishing process, a process in which a metal oxide is formed by an oxidizing agent and a process in which polishing particles are removed from the formed metal oxide occur repeatedly.

In general, since the metal film has high strength, it is difficult to polish the metal film. In order to effectively polish the metal film, the metal film is oxidized in the form of a metal oxide having relatively low strength, and then the polishing is performed.

In order to polish the metal film as described above, a method of oxidizing the metal film is used, but the efficiency of a chemical conversion process for generating dishing or erosion on the metal film to be polished and oxidizing the metal film to a metal oxide form is not sufficiently satisfactory.

Accordingly, while minimizing the occurrence of dishing and erosion in the polished metal film, the control of a polishing rate ratio for the metal film to be polished and insulating to film is a very important task in the development of a polishing slurry composition.

SUMMARY

An aspect is directed to providing a polishing slurry composition capable of securing process reproducibility in a continuous polishing process while achieving desired polishing performance (polishing rate, etc.).

However, the aspects of the present disclosure are not limited to those mentioned above, and other aspects not mentioned herein will be clearly understood by those skilled in the art from the following description.

A polishing slurry composition according to an example embodiment of the present disclosure includes: polishing particles; a first polishing inhibitor containing a hydrophobic amino acid; and a second polishing inhibitor containing a cyclic polymer, in which the first polishing inhibitor and the second polishing inhibitor may be different.

According to an example embodiment of the present disclosure, the polishing particles include at least one of a metal oxide, an organic material or a metal oxide coated with an organic material, and a metal oxide in a colloidal state, in which the metal oxide may include at least one selected from the group consisting of silica, ceria, zirconia, alumina, titania, barium titania, germania, mangania and magnesia.

According to an example embodiment of the present disclosure, the polishing particles may be in an amount of 0.1 wt % to 10 wt %.

According to an example embodiment of the present disclosure, the polishing particles may be a single size particle having a size of 20 nm to 200 nm or a mixed particle of two or more types thereof.

According to an example embodiment of the present disclosure, the first polishing inhibitor may include at least one selected from the group consisting of glycine, alanine, valine, leucine, isoleucine, proline, phenylalanine, methionine, and tryptophan.

According to an example embodiment of the present disclosure, the first polishing inhibitor may be in an amount of 0.005 wt % to 5 wt %.

According to an example embodiment of the present disclosure, the second polishing inhibitor may include at least three glycosidic bonds.

According to an example embodiment of the present disclosure, the second polishing inhibitor may further include a primary to tertiary nitrogen atom in addition to a hydroxyl group (—OH).

According to an example embodiment of the present disclosure, the second polishing inhibitor may include at least one of xanthan gum, guar gum, chitin, chitosan, and dextrin.

According to an example embodiment of the present disclosure, the second polishing inhibitor may be in an amount of 0.005 wt % to 5 wt %.

The polishing slurry composition according to an example embodiment of the present disclosure further includes an oxidizing agent, in which the oxidizing agent includes at least one of hydrogen peroxide, urea hydrogen peroxide, urea, percarbonate, periodic acid, periodate, perchloric acid, perchlorate, perbromic acid, perbromate, perboric acid, perborate, potassium permanganate, sodium perborate, permanganic acid, permanganate, persulfate, bromate, chlorite, chlorate, chromate, dichromate, chromium compound, iodate, iodic acid, ammonium persulfate, benzoyl peroxide, calcium peroxide, barium peroxide, sodium peroxide, dioxygenyl, ozone, ozonide, nitrate, hypochlorite, hypohalite, chromium trioxide, pyridinium chlorochromate, nitrous oxide, monopersulfate salt, dipersulfate salt, and sodium peroxide. The oxidizing agent may be in an amount of 0.01 wt % to 5 wt %.

The polishing slurry composition according to an example embodiment of the present disclosure further includes iron (Fe) ions, in which the iron (Fe) ions are provided from an iron compound including at least one of iron (II) nitrate, iron (III) nitrate, iron (II) sulfate, iron (III) sulfate, iron (II)

formate, iron (III) formate, iron (II) acetate, iron (III) acetate, iron (II) carbonate, iron (III) carbonate, iron (II) chloride, iron (III) chloride, iron (II) bromide, iron (III) bromide, iron (II) iodide, iron (III) iodide, iron (II) hydroxide, iron (III) hydroxide, iron (II) oxide, iron (III) oxide, iron (II) acetylacetonate, iron (III) acetylacetonate, iron (II) carbon monoxide, iron (III) carbon monoxide, iron (III) citrate, iron (III) oxalate, iron (III) fumarate, iron (III) lactate, iron (III) perchlorate, ammonium hexacyanoferrate (III), potassium hexacyanoferrate (III), ammonium iron (III) sulfate, and potassium iron (III) sulfate. The iron (Fe) ion may be in an amount of 0.0001 wt % to 5 wt %.

The polishing slurry composition according to an example embodiment of the present disclosure further includes a pH adjusting agent, in which the pH adjusting agent includes at least one of an inorganic acid or inorganic acid salt including at least one of nitric acid, hydrochloric acid, phosphoric acid, sulfuric acid, hydrofluoric acid, bromic acid, iodic acid and salts thereof and an organic acid or organic acid salt including at least one of formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof. The pH of the polishing slurry composition may range from 2 to 7.

According to an example embodiment of the present disclosure, in the polishing slurry composition, the film to be polished is a metal film, and the metal film includes at least one of a metal, a metal nitride, a metal oxide, and a metal alloy. The metal, metal nitrides, metal oxides and metal alloys may include at least one of indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), and tungsten (W), respectively.

According to an example embodiment of the present disclosure, a polishing rate of the polishing slurry composition for a film to be polished may be 500 Å/min or more.

According to an example embodiment of the present disclosure, a maximum protrusion step of a film surface after polishing a film to be polished using the polishing slurry composition may be 70 Å or less.

According to an example embodiment of the present disclosure, an erosion value of a film surface after polishing using the polishing slurry composition may be 160 Å or less.

The polishing slurry composition according to the present disclosure may provide a slurry composition for a semiconductor planarization process having a high polishing selectivity of a metal film.

The polishing slurry composition according to the present disclosure may prevent a phenomenon in which the polishing target layer is excessively removed and recessed, or an insulating layer or barrier layer collapses due to the physical action of polishing particles (erosion) as a phenomenon that may occur during a semiconductor planarization process.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail. However, since various changes may be made to the example embodiments, the scope of right of the patent application is not limited or restricted by these example embodiments. It should be understood that all modifications, equivalents and substitutes for the example embodiments are included within the scope of right.

The terms used in the example embodiments are used for description purposes only, and should not be construed as being limited by these example embodiments. The terms of a singular form may include plural forms unless otherwise specified. It will be understood that the terms "comprising" or "having," when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all technical and scientific terms used in the example embodiments have the same meanings as commonly understood by a skilled expert in the technical field to which the present disclosure belongs. It will be further understood that terms, such as those defined in commonly used dictionaries, should be interpreted as having a meaning that is consistent with their meanings in the context of the relevant art and the present disclosure, and will not be interpreted in an idealized or overly formal sense unless expressly so defined herein.

Further, in describing components of the example embodiments, terms such as first, second, A, B, (a), (b), and like may be used. These terms are merely used to distinguish the components from other components and a property, an order, or a sequence of the corresponding component is not limited by the term. When it is described that one component is "connected," "coupled" or "joined" to another component, the one component may be directly connected or joined to another component. However, it should be understood that another component may be "connected", "coupled" or "joined" between each component.

Components included in an example embodiment and components having a common function will be described using the same names in other example embodiments. Unless otherwise stated, descriptions described in an example embodiment may be applied to other example embodiments as well, and detailed descriptions within the overlapping range will be omitted.

According to an example embodiment of the present disclosure, a polishing slurry composition includes: polishing particles; a first polishing inhibitor containing a hydrophobic amino acid; and a second polishing inhibitor containing a cyclic polymer, in which the first polishing inhibitor and the second polishing inhibitor may be different.

According to an example embodiment, the polishing particles may be at least one of spherical, prismatic, needle-shaped and plate-shaped polishing particles.

According to an example embodiment, the polishing particles may have a specific surface area of 30 $m^2/g$ to 150 $m^2/g$.

According to an example embodiment, the polishing particles may be single-sized particles having a specific surface area of 30 $m^2/g$ to 150 $m^2/g$ or mixed particles of two or more types.

According to an example embodiment, the polishing particles may include first polishing particles having a specific surface area of 30 $m^2/g$ to 80 $m^2/g$ and second polishing particles having a specific surface area of 80 $m^2/g$ to 150 $m^2/g$, in which a mass ratio of the first polishing particles to the second polishing particles may be 1:0.1 to 10.

According to an example embodiment, the polishing slurry composition includes two or more different polishing inhibitors, and is able to suppress aggregation of each polishing inhibitor and prevent over-polishing due to polishing particles.

According to an example embodiment of the present disclosure, the polishing particles include at least one of a metal oxide, an organic material or a metal oxide coated with an organic material, and a metal oxide in a colloidal state, in which the metal oxide may include at least one of silica, ceria, zirconia, alumina, titania, barium titania, germania, mangania and magnesia.

In an example embodiment, the polishing particles may be colloidal silica.

According to an example embodiment, the polishing particles may be prepared by a liquid phase method and dispersed so that the surface of the polishing particles has a negative charge. However, the polishing particles according to the present disclosure are not limited to the polishing particles prepared by the liquid phase method.

According to an example embodiment, the polishing particles prepared by the liquid phase method may have a surface of the polishing particles dispersed with negative charges.

According to an example embodiment, the polishing particles may be monocrystalline. When monocrystalline polishing particles are used, a scratch reduction may be achieved compared to polycrystalline polishing particles, dishing may be improved, and cleanability after polishing may be improved.

According to an example embodiment of the present disclosure, the polishing particles may be in an amount of 0.1 wt % to 10 wt %.

According to an example embodiment, when the polishing particles are in an amount of less than 0.1 wt %, a polishing rate is reduced. When the polishing particles are in an amount exceeding 10 wt %, a polishing rate is too high, and surface defects may occur due to the adsorption of particles remaining on the surface due to the increase in the number of polishing particles.

According to an example embodiment, the polishing particles may be, preferably, in an amount of 1 wt % to 5 wt %.

According to an example embodiment of the present disclosure, the polishing particles may be a single size particle having a size of 20 nm to 200 nm or a mixed particle of two or more types.

According to an example embodiment, the polishing particles may secure a desired polishing rate.

According to an example embodiment, when the size of the polishing particles is larger than 200 nm, over-polishing may occur, and when the size of the polishing particles is smaller than 20 nm, the size may be too small, and the polishing may not proceed smoothly. In particular, when over-polishing occurs, secondary defects such as dishing or erosion in the pattern may be caused.

According to an example embodiment, the size of the polishing particles corresponds to an average particle diameter and is an average value of particle diameters of a plurality of polishing particles within a range that may be measured by scanning electron microscope analysis or dynamic light scattering.

According to an example embodiment, the polishing particles may include, in addition to single-size particles, polishing particles having a multimodal distribution type particle distribution.

As an example, two kinds of polishing particles having different average particle sizes may be mixed to have a bimodal distribution of particles, or three or more kinds of polishing particles having different average particle sizes may be mixed. When two or more polishing particles having an average particle size are mixed and used, relatively large and small polishing particles are mixed to have better dispersibility and a reduction on scratches on the semiconductor wafer surface may be expected.

According to an example embodiment of the present disclosure, the first polishing inhibitor may include at least one of glycine, alanine, valine, leucine, isoleucine, proline, phenylalanine, methionine, and tryptophan.

According to an example embodiment, the first polishing inhibitor may be an amino acid.

According to an example embodiment, the first polishing inhibitor may include a hydrophobic amino acid.

According to an example embodiment of the present disclosure, the first polishing inhibitor may be in an amount of 0.005 wt % to 5 wt %.

According to an example embodiment, when the first polishing inhibitor is in an amount of less than 0.005 wt %, it is difficult to achieve a desired polishing rate. When the first polishing inhibitor is in an amount exceeding 5 wt %, agglomeration occurs, resulting in deterioration of polishing performance, protrusion, dishing, and erosion.

According to an example embodiment of the present disclosure, the second polishing inhibitor may include at least three glycosidic bonds.

According to an example embodiment of the present disclosure, the second polishing inhibitor may include at least one selected from the group of materials having a glycosidic bond.

According to an example embodiment, the second polishing inhibitor may include at least one selected from the group of materials having at least three glycosidic bonds.

According to an example embodiment, the second polishing inhibitor may include a cyclic polymer.

According to an example embodiment, the second polishing inhibitor may include a cyclic polymer having at least three glycosidic bonds.

According to an example embodiment of the present disclosure, the second polishing inhibitor may further include a primary to tertiary nitrogen atom in addition to a hydroxyl group (—OH).

According to an example embodiment, the second polishing inhibitor may include a polymer including at least one functional group selected from the group consisting of a primary amine, a secondary amine, and a tertiary amine.

According to an example embodiment of the present disclosure, the second polishing inhibitor may include at least one of xanthan gum, guar gum, chitin, chitosan, and dextrin.

According to an example embodiment of the present disclosure, the second polishing inhibitor may be in an amount of 0.005 wt % to 5 wt %.

According to an example embodiment, when the second polishing inhibitor is in an amount of less than 0.005 wt %, the effect of the polishing inhibitor is insignificant, resulting in over-etching of the film to be polished, and secondary defects such as dishing, or erosion may not be improved. When the second polishing inhibitor is in an amount exceeding 5 wt %, the viscosity of the polishing slurry composition increases to affect the flow, which may cause secondary issues such as a change in the profile of the pattern.

The polishing slurry composition according to an example embodiment of the present disclosure further includes an oxidizing agent, in which the oxidizing agent includes at least one of hydrogen peroxide, urea hydrogen peroxide, urea, percarbonate, periodic acid, periodate, perchloric acid, perchlorate, perbromic acid, perbromate, perboric acid, perborate, potassium permanganate, sodium perborate, permanganic acid, permanganate, persulfate, bromate, chlorite, chlorate, chromate, dichromate, chromium compound, iodate, iodic acid, ammonium persulfate, benzoyl peroxide, calcium peroxide, barium peroxide, sodium peroxide, dioxygenyl, ozone, ozonide, nitrate, hypochlorite, hypohalite, chromium trioxide, pyridinium chlorochromate, nitrous oxide, monopersulfate salt, dipersulfate salt, and sodium peroxide. The oxidizing agent may be in an amount of 0.01 wt % to 5 wt %.

According to an example embodiment, when the oxidizing agent is in an amount of less than 0.01 wt %, the polishing rate and oxidation rate for the film to be polished may be lowered. When the oxidizing agent is in an amount exceeding 5 wt %, the film surface is excessively etched to cause dishing or erosion in the pattern.

The polishing slurry composition according to an example embodiment of the present disclosure further includes iron (Fe) ions, in which the iron (Fe) ions are provided from an iron compound including at least one of iron (II) nitrate, iron (III) nitrate, iron (II) sulfate, iron (III) sulfate, iron (II) formate, iron (III) formate, iron (II) acetate, iron (III) acetate, iron (II) carbonate, iron (III) carbonate, iron (II) chloride, iron (III) chloride, iron (II) bromide, iron (III) bromide, iron (II) iodide, iron (III) iodide, iron (II) hydroxide, iron (III) hydroxide, iron (II) oxide, iron (III) oxide, iron (II) acetylacetonate, iron (III) acetylacetonate, iron (II) carbon monoxide, iron (III) carbon monoxide, iron (III) citrate, iron (III) oxalate, iron (III) fumarate, iron (III) lactate, iron (III) perchlorate, ammonium hexacyanoferrate (III), potassium hexacyanoferrate (III), ammonium iron (III) sulfate, and potassium iron (III) sulfate. The iron (Fe) ion may be in an amount of 0.0001 wt % to 5 wt %.

According to an example embodiment, when the iron ion is in an amount of less than 0.0001 wt %, the synergistic effect of polishing and metal film oxidation may not be sufficiently obtained. When the iron ion is in an amount exceeding 5 wt %, iron atoms may be used and may cause difficulty in controlling the polishing rate.

The polishing slurry composition according to an example embodiment of the present disclosure further includes a pH adjusting agent, in which the pH adjusting agent includes at least one of an inorganic acid or inorganic acid salt including at least one of nitric acid, hydrochloric acid, phosphoric acid, sulfuric acid, hydrofluoric acid, bromic acid, iodic acid and salts thereof and an organic acid or organic acid salt including at least one of formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof. The pH of the polishing slurry composition may range from 2 to 7.

According to an example embodiment, the pH adjusting agent may be a material used to implement a pH range in which high-speed polishing performance and a good polishing surface may be secured for the film to be polished because it is advantageous in dispersion stability.

According to one example embodiment, the pH of the polishing slurry composition may be, preferably, 2 to 4.

According to one example embodiment, the pH adjusting agent may be added in an appropriate amount to control the pH of the polishing slurry composition.

According to an example embodiment, when the pH of the polishing slurry composition goes beyond the above range, the polishing rate of the metal film is lowered, the surface roughness is not constant, and defects such as corrosion, etching, dishing, erosion, and surface imbalance may occur.

According to an example embodiment, the pH of the polishing slurry composition may be controlled by adding a pH adjusting agent.

According to an example embodiment of the present disclosure, in the polishing slurry composition, the film to be polished is a metal film, and the metal film includes at least one of a metal, a metal nitride, a metal oxide, and a metal alloy. The metal, metal nitrides, metal oxides and metal alloys may include at least one of indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), and tungsten (W), respectively.

According to an example embodiment of the present disclosure, a polishing rate of the polishing slurry composition for a film to be polished may be 500 Å/min or more.

According to an example embodiment, the polishing rate of the polishing slurry composition for the film to be polished may be 1,000 Å/min to 4,000 Å/min, and when the film to be polished, for example, a metal film, is polished, the polishing selectivity ratio of the polishing rate of the metal film to another film, for example, an oxide film may be 20 or more.

According to an example embodiment of the present disclosure, a maximum protrusion step of the surface of a film to be polished after polishing using the polishing slurry composition may be 70 Å or less.

According to an example embodiment of the present disclosure, an erosion value of the film surface after polishing using the polishing slurry composition may be 160 Å or less.

According to an example embodiment, the erosion value of the film surface after polishing using the polishing slurry composition may be 100 Å or less.

Hereinafter, the present disclosure will be described in more detail by way of Examples and Comparative Examples.

However, the following examples are only for illustrating the present disclosure, and the content of the present disclosure is not limited to the following examples.

Example 1

3.5 wt % of colloidal silica polishing particles having a particle size of 120 nm, 0.1 wt % of alanine as a first polishing inhibitor, 0.2 wt % of dextrin as a second polishing inhibitor, 0.5 wt % of hydrogen peroxide as an oxidizing agent, and 0.01 wt % of iron ions were mixed to prepare a polishing slurry composition.

Example 2

A polishing slurry composition was prepared in the same manner as in Example 1, except that the first polishing inhibitor in Example 1 was changed to an amount of 0.5 wt %.

Example 3

A polishing slurry composition was prepared in the same manner as in Example 1, except that in Example 1, the first polishing inhibitor was changed to 0.1 wt % of isoleucine and the second polishing inhibitor was changed to 0.2 wt % of guar gum.

Example 4

A polishing slurry composition was prepared in the same manner as in Example 3, except that in Example 3, the first polishing inhibitor was changed to an amount of 0.5 wt % and the second polishing inhibitor was changed to an amount of 0.1 wt %.

Example 5

A polishing slurry composition was prepared in the same manner as in Example 1, except that in Example 1, the first polishing inhibitor was changed to 0.1 wt % of tryptophan and the second polishing inhibitor was changed to 0.1 wt % of chitin.

Example 6

A polishing slurry composition was prepared in the same manner as in Example 5, except that the first polishing inhibitor in Example 5 was changed to an amount of 0.5 wt %.

Comparative Example 1

A polishing slurry composition was prepared in the same manner as in Example 1, except that in Example 1, the first polishing inhibitor and the second polishing inhibitor were not included.

Comparative Example 2

A polishing slurry composition was prepared in the same manner as in Example 1, except that in Example 1, 0.1 wt % of histidine was included as the first polishing inhibitor and the second polishing inhibitor was not included.

Comparative Example 3

A polishing slurry composition was prepared in the same manner as in Example 1, except that in Example 1, 0.5 wt % of histidine was included as the first polishing inhibitor and the second polishing inhibitor was not included.

Comparative Example 4

A polishing slurry composition was prepared in the same manner as in Example 1, except that in Example 1, 0.1 wt % of arginine was included as the first polishing inhibitor and the second polishing inhibitor was not included.

Comparative Example 5

A polishing slurry composition was prepared in the same manner as in Example 1, except that in Example 1, 0.5 wt % of arginine was included as the first polishing inhibitor and the second polishing inhibitor was not included.

The compositions of the polishing slurry compositions according to Examples 1 to 6 and Comparative Examples 1 to 5 are summarized in Table 1 below.

TABLE 1

| Items | Polishing particles | wt % | First polishing inhibitor | wt % | Second polishing inhibitor | wt % | Oxidizing agent | wt % | Iron ions | wt % |
|---|---|---|---|---|---|---|---|---|---|---|
| Example 1 | Silica | 3.5 | Alanine | 0.1 | Dextrin | 0.2 | Hydrogen peroxide | 0.5 | Fe ions | 0.03 |
| Example 2 | Silica | 3.5 | Alanine | 0.5 | Dextrin | 0.2 | Hydrogen peroxide | 0.5 | Fe ions | 0.03 |
| Example 3 | Silica | 3.5 | Isoleucine | 0.1 | Guar gum | 0.2 | Hydrogen peroxide | 0.5 | Fe ions | 0.03 |
| Example 4 | Silica | 3.5 | Isoleucine | 0.5 | Guar gum | 0.1 | Hydrogen peroxide | 0.5 | Fe ions | 0.03 |
| Example 5 | Silica | 3.5 | Tryptophan | 0.1 | Chitin | 0.1 | Hydrogen peroxide | 0.5 | Fe ions | 0.03 |
| Example 6 | Silica | 3.5 | Tryptophan | 0.5 | Chitin | 0.1 | Hydrogen peroxide | 0.5 | Fe ions | 0.03 |
| Com. Example 1 | Silica | 3.5 | — | — | — | — | Hydrogen peroxide | 0.5 | Fe ions | 0.03 |
| Com. Example 2 | Silica | 3.5 | Histidine | 0.1 | — | — | Hydrogen peroxide | 0.5 | Fe ions | 0.03 |
| Com. Example 3 | Silica | 3.5 | Histidine | 0.5 | — | — | Hydrogen peroxide | 0.5 | Fe ions | 0.03 |
| Com. Example 4 | Silica | 3.5 | Arginine | 0.1 | — | — | Hydrogen peroxide | 0.5 | Fe ions | 0.03 |
| Com. Example 5 | Silica | 3.5 | Arginine | 0.5 | — | — | Hydrogen peroxide | 0.5 | Fe ions | 0.03 |

Evaluation of Polishing Properties of Polishing Slurry Compositions

The tungsten film-containing substrate was polished under the following polishing conditions using the polishing slurry compositions of Examples and Comparative Examples.

[Polishing Conditions]
1. Polishing equipment: KCT's ST-01
2. Wafer: 15 cm×15 cm tungsten film wafer
3. Platen pressure: 2 psi
4. Spindle speed: 87 rpm
5. Platen speed: 93 rpm
6. Flow rate: 250 mL/min After polishing the tungsten film substrate using the polishing slurry compositions according to Examples and Comparative Examples, the polishing rate and the maximum protrusion step and erosion of the pattern surface after polishing were measured, and the results are shown in Table 2, and FIGS. 1 and 2.

Figure 1:
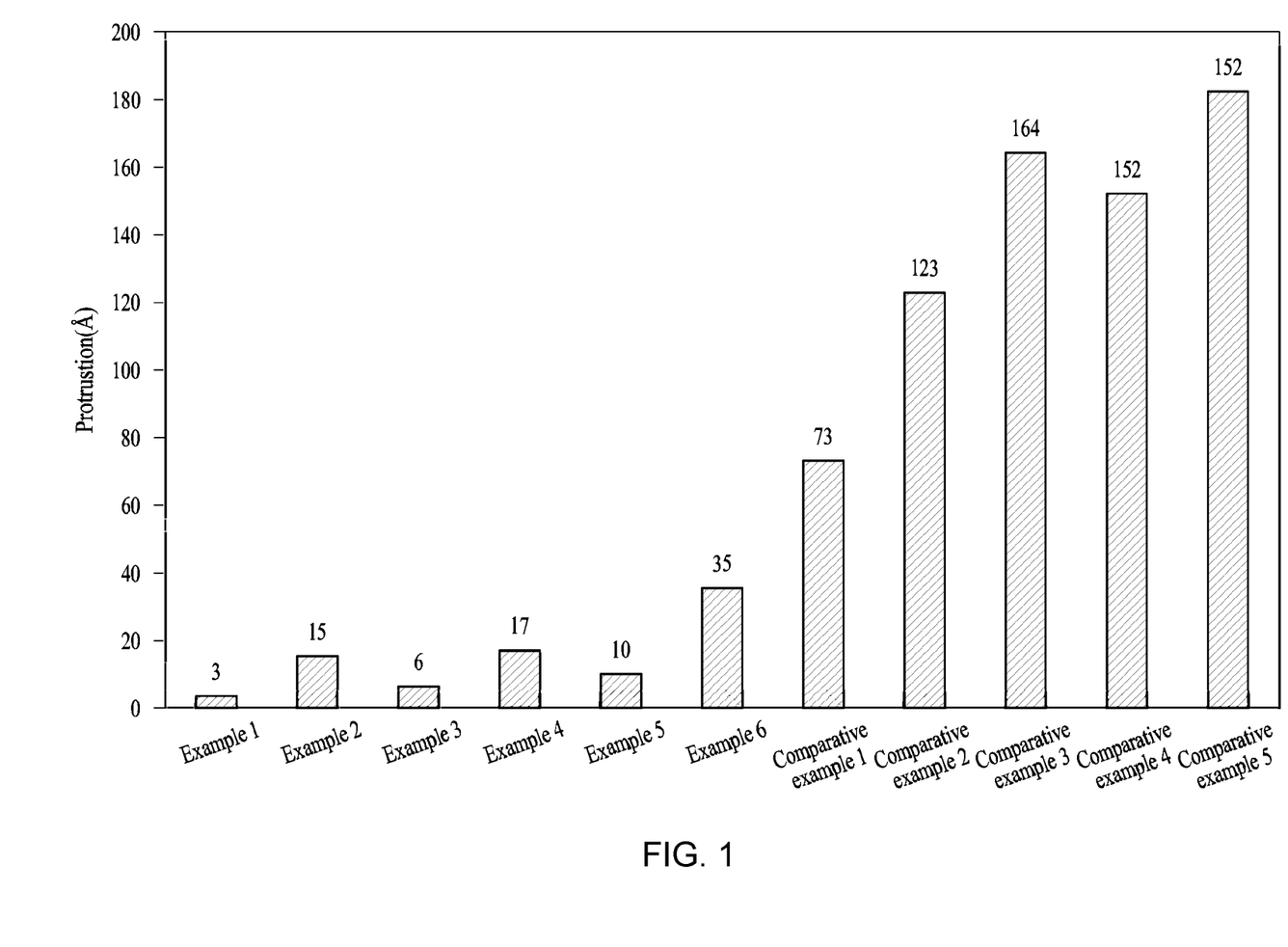
FIG. 1 is a graph showing a maximum protrusion step according to the polishing of a tungsten film substrate of a polishing slurry composition according to Examples and Comparative Examples.

FIG. 1 is a graph showing a maximum protrusion step according to the polishing of a tungsten film substrate of a polishing slurry composition according to Examples and Comparative Examples.

Figure 2:
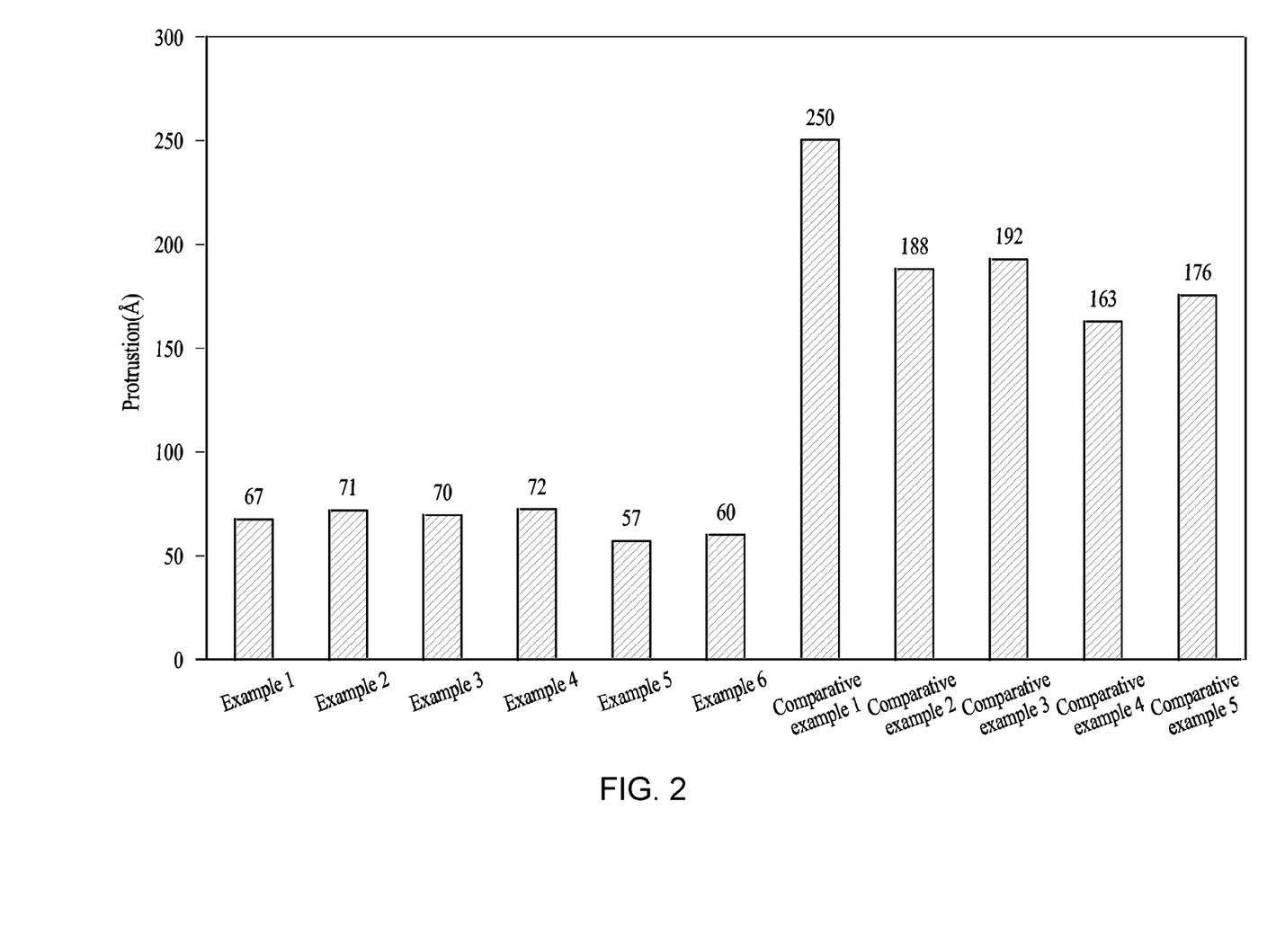
FIG. 2 is a graph showing erosion according to the polishing of a tungsten film substrate of a polishing slurry composition according to Examples and Comparative Examples.

FIG. 2 is a graph showing erosion according to the polishing of a tungsten film substrate of a polishing slurry composition according to Examples and Comparative Examples.

TABLE 2

| Items | Protrusion [Å] | Erosion [Å] |
|---|---|---|
| Example 1 | 3.0 | 67 |
| Example 2 | 15 | 71 |
| Example 3 | 6 | 70 |
| Example 4 | 17 | 72 |
| Example 5 | 10 | 57 |
| Example 6 | 35 | 60 |
| Comparative Example 1 | 73 | 250 |
| Comparative Example 2 | 123 | 188 |
| Comparative Example 3 | 164 | 192 |
| Comparative Example 4 | 152 | 163 |
| Comparative Example 5 | 182 | 176 |

Referring to Table 2 and FIGS. 1 and 2, it was identified that there was an effect of minimizing the protrusion step after the polishing process and suppressing erosion while maintaining an appropriate polishing rate for the tungsten film. It was identified that the polishing slurry composition according to the Examples had a relatively low maximum protrusion step value compared to the Comparative Examples that did not include the second polishing inhibitor. On the other hand, in the polishing slurry composition according to Comparative Example 1, it was identified that the maximum protrusion step after polishing was measured relatively low compared to the polishing slurry compositions according to Comparative Examples 2 to 5, but it was identified that the most erosion occurred. When using to the polishing slurry compositions according to Examples 1 to 6 containing both the first polishing inhibitor and the second polishing inhibitor, it was identified that the maximum protrusion step was low, and the erosion value was also low.

While the example embodiments have been described above, it will be understood by one of ordinary skill in the art that various technical modifications and variations from the described-above descriptions. For example, suitable results may be achieved even when the techniques described may be performed in a different order than the described methods, and/or that components of the described systems, structures, devices, circuits, etc. are connected or combined in a different manner from the described methods or are replaced or substituted by other components or equivalents.

Therefore, other implementations, other example embodiments, and equivalents to the claims are also within the scope of the following claims.

What is claimed is:

1. A polishing slurry composition comprising:
polishing particles;
a first polishing inhibitor containing a hydrophobic amino acid;
a second polishing inhibitor containing a cyclic polymer;
an oxidizing agent; and
iron (Fe) ions,
wherein:
the first polishing inhibitor and the second polishing inhibitor are different,
the first polishing inhibitor comprises at least one selected from the group consisting of alanine, isoleucine, and proline,
the second polishing inhibitor comprises at least one selected from the group consisting of guar gum, chitin, and dextrin,
the oxidizing agent is in an amount of 0.01 wt % to 5 wt %,
the iron (Fe) ion is in an amount of 0.0001 wt % to 5 wt %, and
a maximum protrusion step of a film surface after polishing a film to be polished using the polishing slurry composition is 70 Å or less.

2. The polishing slurry composition of claim 1, wherein:
the polishing particles comprise at least one selected from the group consisting of a metal oxide, an organic material or a metal oxide coated with an organic material, and a metal oxide in a colloidal state; and
the metal oxide comprises at least one selected from the group consisting of silica, ceria, zirconia, alumina, titania, barium titania, germania, mangania and magnesia.

3. The polishing slurry composition of claim 1, wherein the polishing particles are in an amount of 0.1 wt % to 10 wt %.

4. The polishing slurry composition of claim 1, wherein the polishing particles are a single size particle having a size of 20 nm to 200 nm or a mixed particle of two or more types thereof.

5. The polishing slurry composition of claim 1, wherein the first polishing inhibitor is in an amount of 0.005 wt % to 5 wt %.

6. The polishing slurry composition of claim 1, wherein the second polishing inhibitor is in an amount of 0.005 wt % to 5 wt %.

7. The polishing slurry composition of claim 1, wherein:
the oxidizing agent comprises at least one selected from the group consisting of hydrogen peroxide, urea hydrogen peroxide, urea, percarbonate, periodic acid, periodate, perchloric acid, perchlorate, perbromic acid, perbromate, perboric acid, perborate, potassium permanganate, sodium perborate, permanganic acid, permanganate, persulfate, bromate, chlorite, chlorate, chromate, dichromate, chromium compound, iodate, iodic acid, ammonium persulfate, benzoyl peroxide, calcium peroxide, barium peroxide, sodium peroxide, dioxygenyl, ozone, ozonide, nitrate, hypochlorite, hypohalite, chromium trioxide, pyridinium chlorochromate, nitrous oxide, monopersulfate salt, dipersulfate salt, and sodium peroxide.

8. The polishing slurry composition of claim 1, wherein: the iron (Fe) ions are provided from an iron compound including at least one selected from the group consisting of iron (II) nitrate, iron (III) nitrate, iron (II) sulfate, iron (III) sulfate, iron (II) formate, iron (III) formate, iron (II) acetate, iron (III) acetate, iron (II) carbonate, iron (III) carbonate, iron (II) chloride, iron (III) chloride, iron (II) bromide, iron (III) bromide, iron (II) iodide, iron (III) iodide, iron (II) hydroxide, iron (III) hydroxide, iron (II) oxide, iron (III) oxide, iron (II) acetylacetonate, iron (III) acetylacetonate, iron (II) carbon monoxide, iron (III) carbon monoxide, iron (III) citrate, iron (III) oxalate, iron (III) fumarate, iron (III) lactate, iron (III) perchlorate, ammonium hexacyanoferrate (III), potassium hexacyanoferrate (III), ammonium iron (III) sulfate, and potassium iron (III) sulfate.

9. The polishing slurry composition of claim 1, further comprising a pH adjusting agent, wherein:
the pH adjusting agent comprises at least one selected from the group consisting of an inorganic acid or inorganic acid salt including at least one selected from the group consisting of nitric acid, hydrochloric acid, phosphoric acid, sulfuric acid, hydrofluoric acid, bromic acid, iodic acid and salts thereof; and an organic acid or organic acid salt including at least one selected from the group consisting of formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof; and
pH of the polishing slurry composition ranges from 2 to 7.

10. The polishing slurry composition of claim 1, wherein a polishing rate of the polishing slurry composition for a film to be polished is 500 Å/min or more.

11. The polishing slurry composition of claim 1, wherein an erosion value of a film surface after polishing using the polishing slurry composition is 160 Å or less.

* * * * *